(12) United States Patent
Zhu et al.

(10) Patent No.: US 10,985,044 B2
(45) Date of Patent: Apr. 20, 2021

(54) MACHINE VISION SYSTEM FOR SUBSTRATE ALIGNMENT AND ALIGNMENT DEVICE

(71) Applicant: SHANGHAI MICRO ELECTRONICS EQUIPMENT (GROUP) CO., LTD., Shanghai (CN)

(72) Inventors: Zhi Zhu, Shanghai (CN); Zhijun Huo, Shanghai (CN)

(73) Assignee: Shanghai Micro Electronics Equipment (Group) Co., Ltd., Shanghai (CN)

( * ) Notice: Subject to any disclaimer, the term of this patent is extended or adjusted under 35 U.S.C. 154(b) by 119 days.

(21) Appl. No.: 16/321,632

(22) PCT Filed: Jul. 27, 2017

(86) PCT No.: PCT/CN2017/094769
§ 371 (c)(1),
(2) Date: Jan. 29, 2019

(87) PCT Pub. No.: WO2018/019277
PCT Pub. Date: Feb. 1, 2018

(65) Prior Publication Data
US 2020/0090971 A1 Mar. 19, 2020

(30) Foreign Application Priority Data

Jul. 29, 2016 (CN) .......................... 201610608686.1

(51) Int. Cl.
*H01L 21/68* (2006.01)
*G01B 11/27* (2006.01)
(Continued)

(52) U.S. Cl.
CPC .......... *H01L 21/681* (2013.01); *G01B 11/272* (2013.01); *G02B 21/0016* (2013.01);
(Continued)

(58) Field of Classification Search
CPC . H01L 21/681; H01L 21/67259; H01L 24/75; H01L 2224/75753; G01B 11/272;
(Continued)

(56) References Cited

U.S. PATENT DOCUMENTS

| | | | | |
|---|---|---|---|---|
| 4,899,921 A | * | 2/1990 | Bendat | .................. H01L 21/681 228/105 |
| 2015/0049171 A1 | * | 2/2015 | Ito | .......................... H01L 21/681 348/46 |

FOREIGN PATENT DOCUMENTS

| | | |
|---|---|---|
| CN | 101683749 A | 3/2010 |
| CN | 102881621 A | 1/2013 |

(Continued)

*Primary Examiner* — Dominic J Bologna
(74) *Attorney, Agent, or Firm* — Muncy, Geissler, Olds & Lowe, P.C.

(57) ABSTRACT

A machine vision system for substrate alignment includes first and second illumination sources (11, 12), first and second reflectors (21, 22), first and second objective lenses (31, 32) and first and second detectors (41, 42), each of which pair is symmetric with respect to an X-axis. Light beams emitted from the first and second illumination sources are irradiated on and reflected by respective substrates (1, 2), amplified by the respective objective lenses and received and detected by the respective detectors. An alignment apparatus is also disclosed. Disposing each of the pair of the first and second illumination sources, the first and second reflectors, the first and second objective lenses and the first and second detectors in symmetry with respect to the X-axis results in a significantly reduced footprint of the machine vision system along the orientation of lens barrels of the objective lenses and hence an expanded detection range thereof and improved alignment efficiency and accuracy.

7 Claims, 4 Drawing Sheets

(51) Int. Cl.
*G02B 21/00* (2006.01)
*G02B 21/04* (2006.01)
*G02B 21/18* (2006.01)
*G02B 27/10* (2006.01)
*H01L 21/67* (2006.01)
*H01L 23/00* (2006.01)

(52) U.S. Cl.
CPC ............. *G02B 21/04* (2013.01); *G02B 21/18* (2013.01); *G02B 27/10* (2013.01); *H01L 21/67259* (2013.01); *H01L 24/75* (2013.01); *H01L 2224/75753* (2013.01)

(58) Field of Classification Search
CPC .... G02B 21/0016; G02B 21/04; G02B 21/18; G02B 27/10
See application file for complete search history.

(56) References Cited

FOREIGN PATENT DOCUMENTS

| | | | |
|---|---|---|---|
| CN | 103543609 | A | 1/2014 |
| CN | 104416449 | A | 3/2015 |
| CN | 105023871 | A | 11/2015 |
| CN | 105914171 | A | 8/2016 |
| JP | 63166228 | A | 7/1988 |
| JP | H-02244649 | A | 9/1990 |
| JP | H-0843057 | A | 2/1996 |
| JP | 2005-019873 | A | 1/2005 |
| TW | 201423893 | A | 6/2014 |
| TW | 201546576 | A | 12/2015 |
| WO | WO-2009/125867 | A1 | 10/2009 |
| WO | WO-2016/113225 | A1 | 7/2016 |

\* cited by examiner

MACHINE VISION SYSTEM FOR SUBSTRATE ALIGNMENT AND ALIGNMENT DEVICE

TECHNICAL FIELD

The present invention relates to the field of substrate bonding and, in particular, to a machine vision system for substrate alignment and an alignment apparatus.

BACKGROUND

In a traditional semiconductor process, before two substrates are bonded together, they must be aligned with each other using a substrate bonding apparatus. Substrate alignment is one of the most important techniques involved in substrate bonding.

In an existing substrate alignment method, two substrates to be bonded are first positioned with their respective mark-bearing surfaces facing toward each other, and two sets of microscope objective lenses then detect the positions of the two groups of alignment marks, followed by elimination of an offset therebetween by actuators. Limited to the bonding process, the alignment must be conducted with a spacer inserted between the two substrates for ensuring non-contact between the two substrates prior to the bonding. This creates a rather large gap between the two substrates, and the gap is usually greater than 0.4 mm. Depths of field of the used microscope objective lenses are required to exceed the distance between the two substrates in order to obtain clear images of the alignment marks on the two substrates. However, for any microscope objective lens, there is a tradeoff between its resolution and depth of field. That is, a microscope objective lens with a greater depth of field typically has a lower resolution. For this reason, it is difficult to further increase alignment accuracy by adopting higher-resolution microscope objective lenses due to the depth-of-field constraint.

In order to overcome this problem, there has been proposed an inspection device in the prior art, as shown in FIG. 1, which includes a machine vision system having two pairs of microscope objective lenses 3' both arranged between a first substrate 1' and a second substrate 2' in order to respectively detect alignment marks on the first and second substrates 1', 2' and aligns the first and second substrates 1', 2' by six-degree-of-freedom (6-DOF) movement of motion stages supporting the respective substrates based on the detection results of the objective lenses. In this approach, in order to focus on the first and second substrates 1', 2' and search for the alignment marks, the microscope objective lenses 3' of the machine vision system are required to be movable in all the X, Y and Z directions, but since the microscope objective lenses 3' of the machine vision system are coaxially oriented horizontally, their bulky lens barrels take up much of the space between the substrates, resulting in a limited detection range of the machine vision system in this direction. As a result, some areas of the substrates are not accessible for the machine vision system, limiting its overall alignment accuracy.

SUMMARY OF THE INVENTION

The present invention solves the above problem with the conventional device in which a large footprint of the bulky lens barrels of the coaxially and horizontally oriented microscope objective lenses leads to limited detection range and alignment accuracy by presenting a machine vision system for substrate alignment and alignment apparatus.

To this end, the presented machine vision system for substrate alignment is disposed between first and second substrates arranged in symmetry along an X-axis and includes first and second illumination sources, first and second reflectors, first and second objective lenses and first and second detectors. Each pair of the first and second illumination sources, the first and second reflectors, the first and second objective lenses and the first and second detectors is symmetric with respect to the X-axis, and light beams emitted from the first and second illumination sources are irradiated on and reflected by the respective substrates, amplified by the respective objective lenses and received and detected by the respective detectors.

Further, the first and second illumination sources, the first and second reflectors, the first and second objective lenses and the first and second detectors may be fixed to a base frame to which a driving mechanism is coupled to drive the base frame to move in one or more of X-axis, Y-axis and Z-axis directions, the Y-axis is orthogonal to the X-axis and the Z-axis is orthogonal both to the X-axis and the Y-axis.

Further, the first and second objective lenses may be disposed in symmetry along the X-axis and in positional correspondence with the first and second substrates, respectively, the first and second reflectors are disposed in symmetry with respect to the first and second objective lenses.

Further, the first reflector and first detector may be disposed horizontally along the X-axis, wherein the second reflector and the second detector are disposed horizontally along the X-axis, and wherein the first and second detectors are disposed on a same side of the first and second objective lenses along the X-axis.

Further, a first beam splitter may be provided between the first reflector and the first detector, the first illumination source is in positional correspondence with the first beam splitter, wherein a second beam splitter is provided between the second reflector and the second detector, the second illumination source is in positional correspondence with the second beam splitter, wherein the light beam emitted from the first illumination source is directed by the first beam splitter onto the first reflector, and wherein the light beam emitted from the second illumination source is guided by the second beam splitter onto the second reflector.

Further, a third reflector may be disposed between the first objective lens and the first reflector, wherein a fourth reflector may be disposed between the second objective lens and the second reflector, wherein a light beam from the first reflector is reflected by the third reflector onto the first substrate, reflected by the first substrate, amplified by the first objective lens and deflected successively by the third reflector and the first reflector onto the first detector, and wherein a light beam from the second reflector is reflected by the fourth reflector onto the second substrate, reflected by the second substrate, amplified by the second objective lens and deflected successively by the fourth reflector and the second reflector onto the second detector.

Further, a third beam splitter may be provided between the first and second reflectors in positional correspondence with both the first and second objective lenses, wherein a light beam from the first reflector is guided by the third beam splitter onto the first substrate, reflected by the first substrate, amplified by the first objective lens and successively deflected by the third beam splitter and the first reflector onto the first detector, and wherein a light beam from the second reflector is directed by the third beam splitter onto the second substrate, reflected by the second substrate, amplified by the second objective lens and successively deflected by the third beam splitter and the second reflector onto the second detector.

Further, the first reflector, the first objective lens and the first detector may be arranged side-by-side along the X-axis, the second reflector, the second objective lens and the second detector are arranged side-by-side along the X-axis.

Further, a first beam splitter may be provided between the first objective lens and the first detector, the first illumination source is in positional correspondence with the first beam splitter, wherein a second beam splitter is provided between the second objective lens and the second detector, the second illumination source is in positional correspondence with the second beam splitter, wherein the light beam emitted from the first illumination source is guided by the first beam splitter onto the first reflector, and wherein the light beam emitted from the second illumination source is directed by the second beam splitter onto the second reflector.

Further, a third reflector may be disposed between the first objective lens and the first substrate, wherein a fourth reflector is disposed between the second objective lens and the second substrate, wherein a light beam from the first reflector is guided by the third reflector onto the first substrate, reflected by the first substrate, deflected successively by the third reflector and the first reflector onto the first objective lens, amplified by the first objective lens and received by the first detector; and wherein a light beam from the second reflector is directed by the fourth reflector onto the second substrate, reflected by the second substrate, deflected successively by the fourth reflector and the second reflector onto the second objective lens, amplified by the second objective lens and received by the second detector.

Further, a third beam splitter may be provided between the first and second reflectors, wherein a light beam from the first reflector is directed by the third beam splitter onto the first substrate, reflected by the first substrate, deflected successively by the third beam splitter and the first reflector onto the first objective lens, amplified by the first objective lens and received by the first detector, and wherein a light beam from the second reflector is guided by the third beam splitter onto the second substrate, reflected by the second substrate, deflected successively by the third beam splitter and the second reflector onto the second objective lens, amplified by the second objective lens and received by the second detector.

Further, the first and second illumination sources may be disposed between the first and second reflectors along the X-axis, the first and second illumination sources are in symmetry along the Y-axis and in positional correspondence with the first and second substrates, respectively, and wherein the light beams emitted from the first and second illumination sources are directly irradiated onto the first and second substrates, respectively.

Further, a third reflector may be provided between the first objective lens and the first illumination source, wherein a fourth reflector is provided between the second objective lens and the second illumination source, wherein a light beam reflected from the first substrate is deflected successively by the third reflector and the first reflector onto the first objective lens, amplified by the first objective lens and received by the first detector; and wherein a light beam reflected from the second substrate is deflected successively by the fourth reflector and the second reflector onto the second objective lens, amplified by the second objective lens and received by the second detector.

Further, a third beam splitter may be provided between the first and second illumination sources, and the third beam splitter is in positional correspondence with the first and second illumination sources; wherein a light beam reflected from the first substrate is deflected successively by the third beam splitter and the first reflector onto the first objective lens, amplified by the first objective lens and received by the first detector; and wherein a light beam reflected from the second substrate is deflected successively by the third beam splitter and the second reflector onto the second objective lens, amplified by the second objective lens and received by the second detector.

Further, the first and second detector may be implemented as CCD cameras.

The present invention also provides a substrate alignment apparatus including the machine vision system for substrate alignment as described above.

In the machine vision system and the alignment apparatus of the present invention, each of the pairs of the first and second illumination sources, the first and second reflectors, the first and second objective lenses and the first and second detectors is symmetric with respect to the X-axis, and the light beams from the first and second illumination sources are irradiated on and reflected by the respective corresponding substrates, amplified by the respective corresponding objective lenses and received by the respective corresponding detectors for detection. With such a design, the machine vision system has a much reduced footprint along the orientation of the lens barrels of the objective lenses and hence an expanded detection range and improved alignment efficiency and accuracy.

BRIEF DESCRIPTION OF THE DRAWINGS

In FIG. 1, 1' denotes a first substrate; 2', a second substrate; and 3', a microscope objective lens.

In FIGS. 2-9, 1 denotes a first substrate; 2, a second substrate; 11-12, first and second illumination sources; 21-24, first to fourth reflectors; 31-32, first and second objective lenses; 41-42, first and second detectors; and 51-53, first to third beam splitters.

DETAILED DESCRIPTION

The present invention will now be described in detail with reference to the accompanying drawings.

Embodiment 1

Figure 1:
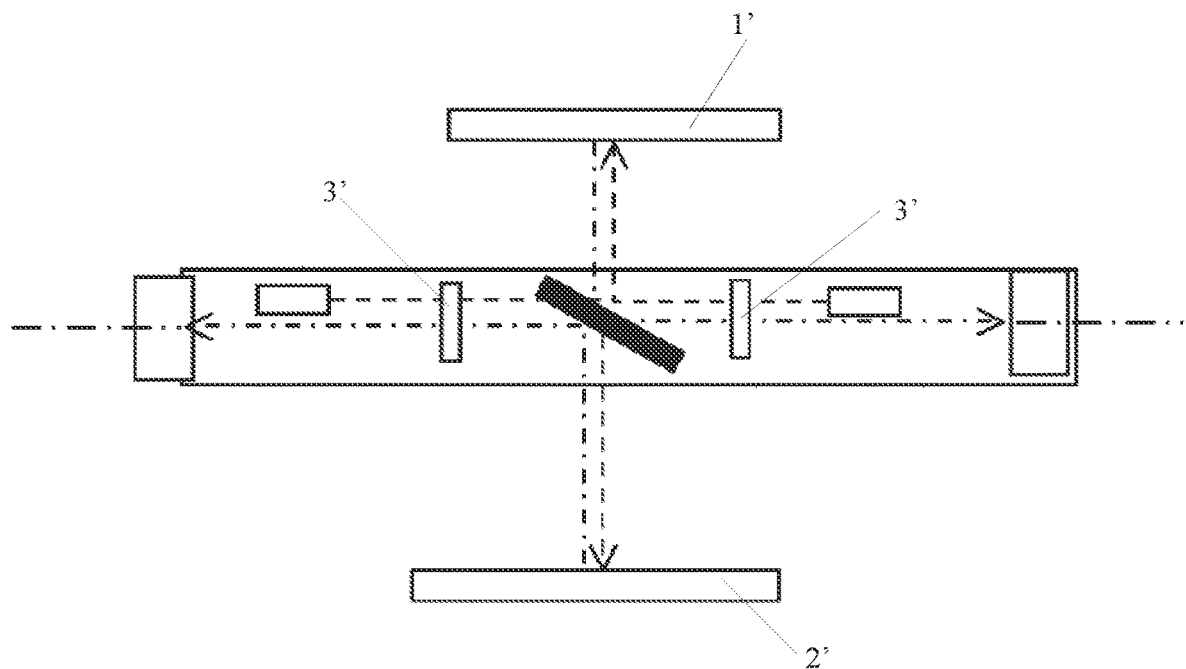
FIG. 1 is a structural schematic of a conventional inspection device.
Figure 2:
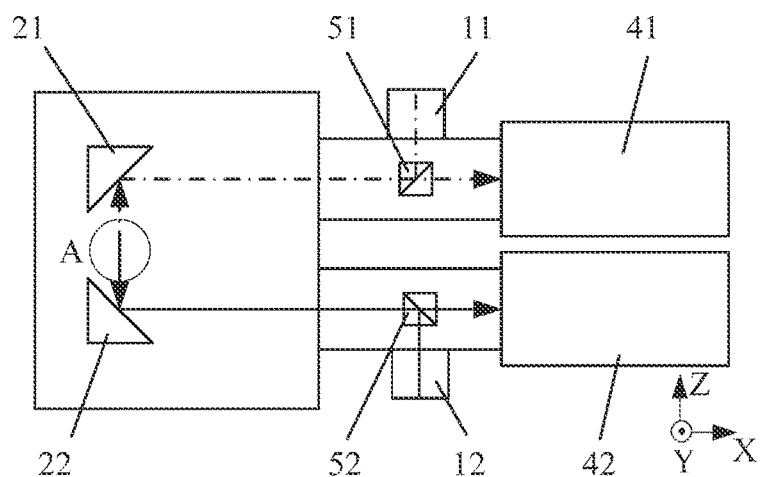
FIG. 2 is a structural schematic of a machine vision system for substrate alignment according to Embodiment 1 of the present invention.
Figure 3:
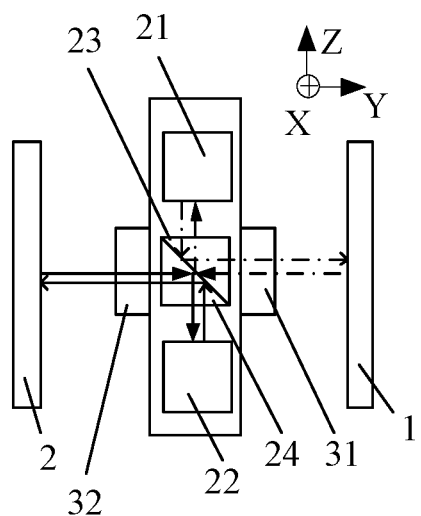
FIG. 3 is a side view of portion A of FIG. 2.

As shown in FIGS. 2-3, the present invention provides a machine vision system for substrate alignment, disposed between first and second substrates held in symmetry along the Y-axis, and including first and second illumination sources 11, 12, first and second reflectors 21, 22 and first and second objective lenses 31, 32 and first and second detectors 41, 42. The first and second illumination sources 11, 12 are disposed in symmetry respect to the X-axis; the first and second reflectors 21, 22 are disposed in symmetry respect to the X-axis; the first and second objective lenses 31, 32 are disposed in symmetry respect to the X-axis; and the first and second detectors 41, 42 are disposed in symmetry respect to the X-axis. Light beams emitted from the first and second illumination sources 11, 12 are irradiated on and reflected by the respective corresponding substrates, amplified by the respective corresponding objective lenses and detected by the respective corresponding detectors. Preferably, the first and second detectors 41, 42 are implemented as CCD cameras. Specifically, the light beam from the first illumination source 11 is irradiated on and reflected by the first substrate 1, amplified by the first objective lens 31 and detected by the first detector 41. The light beam from the second illumination source 12 is irradiated on and reflected by the second substrate 2, amplified by the second objective lens 32 and detected by the second detector 42. The pairs of first and second illumination sources 11, 12, first and second reflectors 21, 22, first and second objective lenses 31, 32 and first and second detectors 41, 42, each disposed in symmetry with respect to the X-axis, constitute two X-axially symmetric detection optical paths for respectively measuring the first and second substrates. With such a design, the machine vision system has a much reduced footprint along the orientation of lens barrels of the objective lenses (i.e., along the X-axis) and hence an expanded detection range and improved alignment efficiency and accuracy.

Preferably, the first and second illumination sources 11, 12, the first and second reflectors 21, 22, the first and second objective lenses 31, 32 and the first and second detectors 41, 42 are all fastened to a base frame to which a driving mechanism is coupled to drive the base frame to move in the X, Y and Z directions to effectuate the measurement of any desired portion of the first and second substrates.

Preferably, the first objective lens 31 and second objective lens 32 are disposed in symmetry along the Y-axis and correspond to the first substrate and the second substrate, respectively. The first and second reflectors 21, 22 are disposed in symmetry with respect to the first and second objective lenses 31, 32. Specifically, the first and second reflectors 21, 22 are disposed on different sides of an X-Y plane. Preferably, the first reflector 21 and the first detector 41 are disposed side-by-side along the X-axis, as well as the second reflector 22 and the second detector 42 are disposed side-by-side along the X-axis. The first and second detectors 41, 42 are disposed on the same side of the first and second objective lenses 31, 32 along the X-axis.

Preferably, a first beam splitter 51 is disposed between the first reflector 21 and the first detector 41. The first beam splitter 51 is in positional correspondence with the first illumination source 11. A second beam splitter 52 is disposed between the second reflector 22 and the second detector 42. The second beam splitter 52 is in positional correspondence with the second illumination source 22. The light beam from the first illumination source 11 is directed by the first beam splitter 51 onto the first reflector 21, and the light beam from the second illumination source 12 is directed by the second beam splitter 52 onto the second reflector 22.

Preferably, a third reflector 23 is provided between the first objective lens 31 and the first reflector 21, and a fourth reflector 24 is provided between the second objective lens 32 and the second reflector 22. The light beam from the first reflector 21 is guided by the third reflector 23 onto the first substrate, reflected by the first substrate onto the first objective lens 31, amplified by the first objective lens and deflected successively by the third reflector 23 and the first reflector 21 onto the first detector 41 for detection. The light beam from the second reflector 22 is directed by the fourth reflector 24 onto the second substrate, reflected by the second substrate onto the second objective lens 32, amplified by the second objective lens and deflected successively by the fourth reflector 24 and the second reflector 22 onto the second detector 42 for detection.

The present invention also provides a substrate alignment apparatus using the machine vision system as defined above.

Embodiment 2

Figure 4:
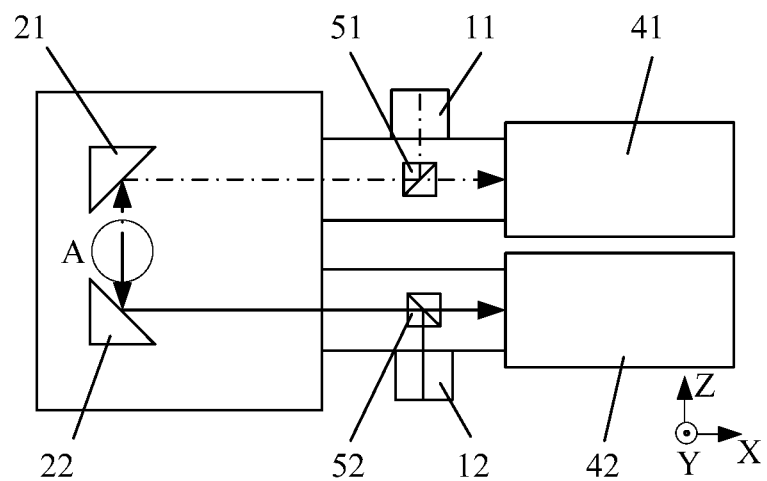
FIG. 4 is a structural schematic of a machine vision system for substrate alignment according to Embodiment 2 of the present invention.
Figure 5:
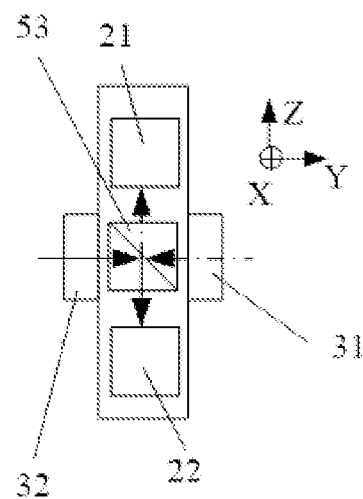
FIG. 5 is a side view of portion A of FIG. 4.

As shown in FIGS. 4-5, differing from Embodiment 1, a third beam splitter 53 (as shown in FIG. 5) is disposed between the first reflector 21 and the second reflector 22. The third beam splitter 53 is in positional correspondence with both the first and second objective lenses 31, 32 in accordance with this Embodiment. The light beam from the first reflector 21 is directed by the third beam splitter 53 onto the first substrate, reflected by the first substrate, amplified by the first objective lens 31 and deflected successively by the third beam splitter 53 and the first reflector 21 onto the first detector 41 for detection. The light beam from the second reflector 22 is guided by the third beam splitter 53 onto the second substrate, reflected by the second substrate, amplified by the second objective lens 32 and deflected successively by third beam splitter 53 and the second reflector 22 onto the second detector 42 for detection. According to this Embodiment, as the single third beam splitter 53 is used to reflect the light beams in the respective optical paths, the light beams from the first and second illumination sources 11, 12 are necessary to have different wavelengths in order to avoid interference inside the third beam splitter 53 which is harmful to the detection.

Embodiment 3

Figure 6:
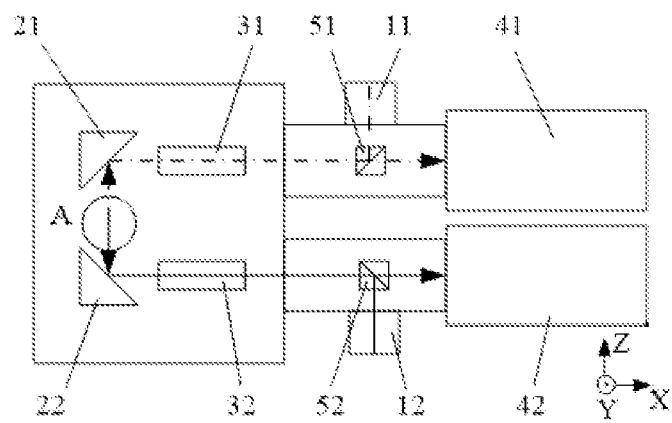
FIG. 6 is a structural schematic of a machine vision system for substrate alignment according to Embodiment 3 of the present invention.
Figure 7:
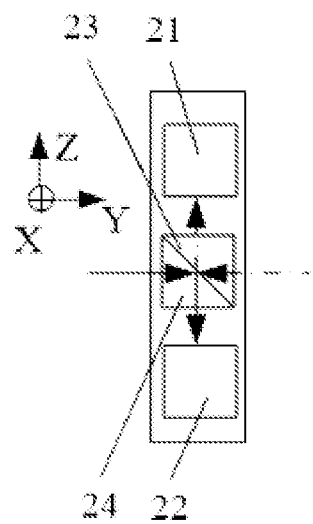
FIG. 7 is a side view of portion A of FIG. 6.

As shown in FIGS. 6-7, differing from Embodiments 1-2, the first reflector 21, the first objective lens 31 and the first detector 41 are arranged side-by-side along the X-axis. The second reflector 22, the second objective lens 32 and the second detector 42 are arranged side-by-side along the X-axis, in accordance with this Embodiment. This arrangement allows larger working distances of the objective lenses, resulting in space savings in the in the Y-axis.

Preferably, the first beam splitter 51 is disposed between the first objective lens 31 and the first detector 41. The first beam splitter 51 is in positional correspondence with the first illumination source 11. The second beam splitter 52 is disposed between the second objective lens 32 and the second detector 42. The second beam splitter 52 is in positional correspondence with the second illumination source 22. The light beam from the first illumination source 11 is directed by the first beam splitter 51 onto the first reflector 21. The light beam from the second illumination source 12 is directed by the second beam splitter 52 onto the second reflector 22.

Preferably, the third reflector 23 is arranged between the first objective lens 31 and the first substrate, and the fourth reflector 24 is arranged between the second objective lens 32 and the second substrate. The light beam from the first reflector 21 is guided by the third reflector 23 onto the first substrate, reflected by the first substrate, deflected successively by the third reflector 23 and the first reflector 21, amplified by the first objective lens 31 and received by the first detector 41 for detection. The light beam from the second reflector 22 is directed by the fourth reflector 24 onto the second substrate, reflected by the second substrate, deflected successively by the fourth reflector 24 and the second reflector 22, amplified by the second objective lens 32 and received by the second detector 42 for detection.

Embodiment 4

Differing from Embodiment 3, the third beam splitter 53 is disposed between the first reflector 21 and the second reflector 22 in accordance with this Embodiment. The light beam from the first reflector 21 is directed by the third beam splitter 53 onto the first substrate, reflected by the first substrate, deflected successively by the third beam splitter 53 and the first reflector 21, amplified by the first objective lens 31 and received by the first detector 41 for detection. The light beam from the second reflector 22 is guided by third beam splitter 53 onto the second substrate, reflected by the second substrate, deflected successively by the third beam splitter 53 and the second reflector 22, amplified by the second objective lens 32 and received by the second detector 42 for detection.

Embodiment 5

Figure 8:
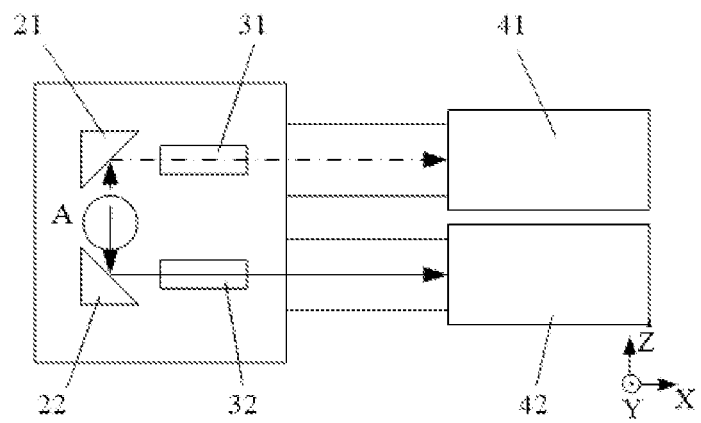
FIG. 8 is a structural schematic of a machine vision system for substrate alignment according to Embodiment 5 of the present invention.
Figure 9:
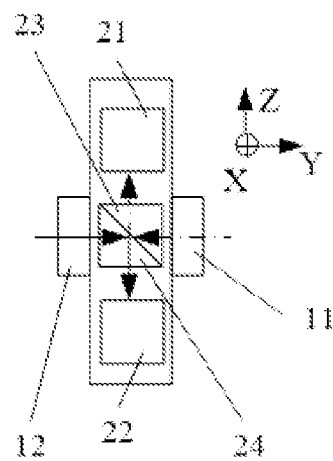
FIG. 9 is a side view of portion A of FIG. 8.

As shown in FIGS. 8-9, differing from Embodiments 3-4, the first illumination source 11 and the second illumination source 12 are disposed in symmetry along the Y-axis between the first reflector 21 and the second reflector 22 and in positional correspondence with the first and second substrates, respectively, in accordance with this Embodiment. The light beams from the first and second illumination sources 11, 12 are directly irradiated on the first substrate and the second substrate, respectively.

Preferably, the third reflector 23 is arranged between the first objective lens 31 and the first illumination source 11, and the fourth reflector 24 is arranged between the second objective lens 32 and the second illumination source 12. The light beam from the first substrate is reflected successively by the third reflector 23 and the first reflector 21, amplified by the first objective lens 31 and received by the first detector 41 for detection. The light beam from the second substrate is reflected successively by the fourth reflector 24 and the second reflector 22, amplified by the second objective lens 32 and received by the second detector 42 for detection.

Embodiment 6

Differing from Embodiment 5, the third beam splitter 53 is provided between the first illumination source 11 and the second illumination source 12. The third beam splitter 53 is in positional correspondence with the first illumination source 11 and the second illumination source 12. The light beam from the first substrate is deflected successively by the third beam splitter 53 and the first reflector 21, amplified by the first objective lens 31 and received by the first detector 41 for detection. The light beam from the second substrate is deflected successively by the third beam splitter 53 and the second reflector 22, amplified by the second objective lens 32 and received by the second detector 42 for detection.

In summary, in the machine vision system and the alignment apparatus of the present invention, the system includes first and second illumination sources 11, 12, first and second reflectors 21, 22, first and second objective lenses 31, 32 and first and second detectors 41, 42. Each pair of the first and second illumination sources 11, 12, the first and second reflectors 21, 22, the first and second objective lenses 31, 32 and the first and second detectors 41, 42, is symmetric with respect to the X-axis, and the light beams from the first and second illumination sources 11, 12 are irradiated on and reflected by the respective corresponding substrates, amplified by the respective corresponding objective lenses and received by the respective corresponding detectors for detection. With such a design that each pair of the first and second illumination sources 11, 12, the first and second reflectors 21, 22, the first and second objective lenses 31, 32 and the first and second detectors 41, 42 is symmetric with respect to the X-axis, the machine vision system has a much reduced footprint along the orientation of the lens barrels of the objective lenses and hence an expanded detection range and improved alignment efficiency and accuracy.

Although specific embodiments of the present invention have been described herein, these are merely illustrative and not intended to limit the scope of the invention in any sense. Various omissions, substitutions and changes made without departing from the spirit of the invention are considered to fall within the scope thereof.

The invention claimed is:

1. A machine vision system for substrate alignment, disposed between first and second substrates arranged in symmetry along a Y-axis, the machine vision system comprising first and second illumination sources, first and second reflectors, first and second objective lenses and first and second detectors, wherein each pair of the first and second illumination sources, the first and second reflectors, the first and second objective lenses and the first and second detectors is symmetric with respect to an X-axis, and wherein light beams emitted from the first and second illumination sources are irradiated on and reflected by the respective substrates, amplified by the respective objective lenses and received and detected by the respective detectors;

wherein the first and second objective lenses are disposed in symmetry along the Y-axis and in positional correspondence with the first and second substrates, respectively, the first and second reflectors disposed in symmetry with respect to the first and second objective lenses.

2. The machine vision system for substrate alignment of claim 1, wherein the first reflector and the first detector are disposed horizontally along the X-axis, wherein the second reflector and the second detector are disposed horizontally along the X-axis, and wherein the first and second detectors are disposed on a same side of the first and second objective lenses along the X-axis.

3. The machine vision system for substrate alignment of claim 2, wherein a first beam splitter is provided between the first reflector and the first detector, the first illumination source being in positional correspondence with the first beam splitter, wherein a second beam splitter is provided between the second reflector and the second detector, the second illumination source being in positional correspondence with the second beam splitter, wherein the light beam emitted from the first illumination source is directed by the first beam splitter onto the first reflector, and wherein the light beam emitted from the second illumination source is guided by the second beam splitter onto the second reflector.

4. The machine vision system for substrate alignment of claim 3, wherein a third reflector is disposed between the first objective lens and the first reflector, and a fourth reflector is disposed between the second objective lens and the second reflector; wherein a light beam from the first reflector is reflected by the third reflector onto the first substrate, reflected by the first substrate, amplified by the first objective lens and deflected successively by the third reflector and the first reflector onto the first detector; and wherein a light beam from the second reflector is reflected by the fourth reflector onto the second substrate, reflected by the second substrate, amplified by the second objective lens and deflected successively by the fourth reflector and the second reflector onto the second detector.

5. The machine vision system for substrate alignment of claim 3, wherein a third beam splitter is provided between the first and second reflectors, the third beam splitter being in positional correspondence with both the first and second objective lenses; wherein a light beam from the first reflector is guided by the third beam splitter onto the first substrate, reflected by the first substrate, amplified by the first objective lens and successively deflected by the third beam splitter and the first reflector onto the first detector; and wherein a light beam from the second reflector is directed by the third beam splitter onto the second substrate, reflected by the second substrate, amplified by the second objective lens and successively deflected by the third beam splitter and the second reflector onto the second detector.

6. The machine vision system for substrate alignment of claim 1, wherein the first and second detector are implemented as CCD cameras.

7. A substrate alignment apparatus, comprising the machine vision system for substrate alignment of claim 1.

* * * * *